United States Patent
Henson et al.

(10) Patent No.: US 7,605,077 B2
(45) Date of Patent: Oct. 20, 2009

(54) DUAL METAL INTEGRATION SCHEME BASED ON FULL SILICIDATION OF THE GATE ELECTRODE

(75) Inventors: William K. Henson, Peekskill, NY (US); Kern Rim, Yorktown Heights, NY (US); Jack A. Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 535 days.

(21) Appl. No.: 11/308,486

(22) Filed: Mar. 29, 2006

(65) Prior Publication Data

US 2007/0228458 A1    Oct. 4, 2007

(51) Int. Cl.
*H01L 21/40* (2006.01)
*H01L 29/45* (2006.01)

(52) U.S. Cl. .............. 438/649; 438/682; 257/E21.156; 257/E29.161

(58) Field of Classification Search .......... 257/369, 257/384, 407, 412, E29.139, E29.16, E29.161, 257/E21.156, E21.164, E21.438, E21.439; 438/199, 591, 683, 233, 585, 586, 630, 649, 438/655, 664, 682, 588, 592, 976

See application file for complete search history.

(56) References Cited

U.S. PATENT DOCUMENTS

| 6,204,103 | B1 |  | 3/2001 | Bai et al. |
| 6,846,734 | B2 | * | 1/2005 | Amos et al. ............... 438/592 |
| 7,187,044 | B2 | * | 3/2007 | Liang et al. ............... 257/407 |
| 7,285,833 | B2 | * | 10/2007 | Wang et al. ............... 257/407 |
| 7,387,927 | B2 | * | 6/2008 | Turkot et al. ............. 438/216 |
| 2002/0096724 | A1 | * | 7/2002 | Liang et al. ............... 257/369 |

* cited by examiner

*Primary Examiner*—Lynne A. Gurley
*Assistant Examiner*—Andrew O. Arena
(74) *Attorney, Agent, or Firm*—Scully, Scott, Murphy & Presser, P.C.; H. Daniel Schurmann

(57) ABSTRACT

An integration scheme that enables full silicidation (FUSI) of the nFET and pFET gate electrodes at the same time as that of the source/drain regions is provided. The FUSI of the gate electrodes eliminates the gate depletion problem that is observed with polysilicon gate electrodes. In addition, the inventive integration scheme creates different silicon thicknesses of the gate electrode just prior to silicidation. This feature of the present invention allows for fabricating nFETs and pFETs that have a band edge workfunction that is tailored for the specific device region.

12 Claims, 4 Drawing Sheets

DUAL METAL INTEGRATION SCHEME BASED ON FULL SILICIDATION OF THE GATE ELECTRODE

FIELD OF THE INVENTION

The present invention relates to a semiconductor structure and a method of fabricating the same. More specifically, the present invention provides a semiconductor structure including a fully silicided nFET gate electrode and a fully silicided pFET gate electrode integrated on the same semiconductor substrate and a method of fabricating the same.

BACKGROUND OF THE INVENTION

In current metal oxide semiconductor field effect transistors (MOSFETs), a polysilicon gate is typically employed. One disadvantage of utilizing polysilicon gates is that at inversion, the polysilicon gates generally experience depletion of carriers in the area of the polysilicon gate that is adjacent to the gate dielectric. This depletion of carriers is referred to in the art as the polysilicon depletion effect. The depletion effect reduces the effective gate capacitance of the MOSFET. Ideally, it is desirable that the gate capacitance of the MOSFET be high since high gate capacitance typically equates to more charge being accumulated. As more charge is accumulated in the channel, the source/drain current becomes higher when the transistor is biased.

MOSFETs including a gate stack comprising a bottom polysilicon portion and a top silicide portion are also known. The layer of silicide in such a gate stack contributes to a decrease in the resistance of the gate. The decrease in resistance causes a decrease in the time propagation delay RC of the gate. Although a silicide top gate region may help decrease the resistance of the transistor, charge is still depleted in the vicinity of the interface formed between the bottom polysilicon gate and gate dielectric, thereby causing a smaller effective gate capacitance.

Another type of MOSFET that is available is one where the gate electrode is made entirely of a metal. In such MOSFETs, the metal of the gate prevents depletion of charge through the gate. This prevents the increase in effective thickness of the gate capacitor and the capacitance increases as a result of the depletion effect.

Although metal gates can be used to eliminate the poly-depletion effect and to provide lower gate resistance, it is generally quite difficult to offer multiple-threshold voltages with metal gates. Multiple-threshold voltages are needed in the semiconductor industry in order to provide design flexibility for low-power, high-performance, and mixed-signal applications for overall system performance. That is, it is difficult to tailor metal gate stacks such that the workfunction thereof meets a desired value for application in a specific device area.

In addition to metal gates, fully silicided metal gates are also known. For example, U.S. Pat. No. 6,204,103 to Bai, et al. discloses a method for forming first and second transistor devices having fully silicided gates. This prior art method includes the steps of forming a first region of silicide over a portion of a gate dielectric that overlies a first well region in a semiconductor substrate; forming a second region of silicide over a second portion of the gate dielectric that overlies a second well region in the substrate; and forming first and second doped regions in the first and second well regions.

U.S. Pat. No. 6,846,734 to Amos et al. discloses another example of a process of forming fully silicided metal gates. In the process disclosed in Amos et al., total silicidation of the gate electrode is achieved utilizing a metal bilayer or a metal alloy layer that is formed upon a Si-containing gate material.

Although technologies exist for forming fully silicided gate electrodes, there exists a need for providing alternative approaches for forming such fully silicided gate electrodes. In particular, a method is needed that enables full silicidation (FUSI) of the gate electrode at the same time as silicidation of the source/drain regions. In addition, a method is also needed that creates different fully silicided gate electrodes of different heights and different phases in each of the device regions that are present within a semiconductor substrate such that the fully silicided gates are tailored to provide a desired workfunction within the specific device region.

SUMMARY OF THE INVENTION

The present application provides an integration scheme that enables full silicidation (FUSI) of the gate electrodes at the same time as that of the source/drain regions. The FUSI of the gate electrodes eliminates the gate depletion problem that is observed with polysilicon gate electrodes. In addition, the inventive integration scheme creates different silicon thicknesses of the gate electrode just prior to silicidation. This feature of the present invention allows for fabricating nFETs and pFETs that have an essential band edge workfunction that is tailored for the specific device region. By "essential band edge workfunction" it is meant a workfunction that is about 200 meV or less from the band edge.

In particular, the present integration scheme permits the fabrication of pFET devices that have a band edge workfunction of about 4.9 to 5.0 eV and nFET devices that have a band edge workfunction of about 4.2 to 4.3 eV. In accordance with the present invention, the pFET devices are fabricated to have a metal rich silicide gate electrode, while the nFET devices are fabricated to have a silicon rich silicide gate electrode (this term is defined in greater detail in the body of this application). That is, the pFET devices are fabricated to have a gate electrode that has a silicide phase which has a higher resistivity as compared to that of the gate electrode in the nFET devices.

In one aspect of the present invention, a method is provided that includes: providing a Si layer on a surface of a gate dielectric layer that is located on a semiconductor substrate having at least one pFET device region and at least one nFET device region, said Si layer atop said at least one pFET device region has a first thickness and said Si layer atop said at least one nFET device region has a second thickness, said first thickness is less than said second thickness;

forming a Ge-containing layer atop said Si layer in both device regions;

forming a least one patterned gate stack in said pFET device region and forming at least one patterned gate stack in said nFET device region, each patterned gate stack comprises, from bottom to top, the gate dielectric layer, the Si layer and the Ge-containing layer;

forming source/drain regions in said semiconductor substrate using each of said patterned gate stacks as an implant mask;

selectively removing the Ge-containing layer of each patterned gate stack thereby exposing said Si layer; and performing a silicidation process that fully converts said Si layer within each device region into a silicide gate electrode, while simultaneously forming silicided source/drain regions, wherein said silicide gate electrode in said pFET device region has a height that is less than a height of the silicide gate electrode in the nFET device region, and the silicide gate electrode in said pFET device region comprises a metal rich silicide phase, while the silicide gate electrode in said nFET device region comprises a silicon rich silicide phase.

The general method of the present invention contemplates two embodiments for forming the Si layer having different thicknesses. In one embodiment, the Si layer having the different thickness is formed by first deposition a blanket layer of silicon atop a gate dielectric layer in both of the device regions. A patterned hard mask is then formed atop the Si layer in the nFET device region thereby protecting the Si layer in that region from a subsequent etching process. The Si layer in the pFET device region is exposed, i.e., not protected by the patterned hard mask. The exposed Si layer in the pFET device region is then thinned utilizing an etching process. In another embodiment, the Si layer having the different thickness is formed by first depositing a blanket layer of silicon atop a gate dielectric layer in both of the device regions. A patterned hard mask is then formed atop the Si layer in the pFET device region thereby protecting the Si layer in that region from a subsequent growth process. The Si layer in the nFET device region is exposed, i.e., not protected by the patterned hard mask. Another Si layer is then formed atop the exposed Si layer in the nFET device region.

In addition to the method described above, the present invention also provides a semiconductor structure that includes fully silicided gates of different thickness and different silicide phases. More specifically, the present invention provides a semiconductor structure including:

a semiconductor substrate having at least one pFET device region and at least one nFET device region; and a pFET silicide gate electrode having a first height located in said at least one pFET device region and an nFET silicide gate electrode having a second height that is greater than the first height in said at least one nFET device region, wherein said pFET silicide gate electrode comprises a metal rich silicide phase, while the nFET silicide gate electrode comprises a silicon rich silicide phase.

DETAILED DESCRIPTION OF THE INVENTION

Figure 1A:
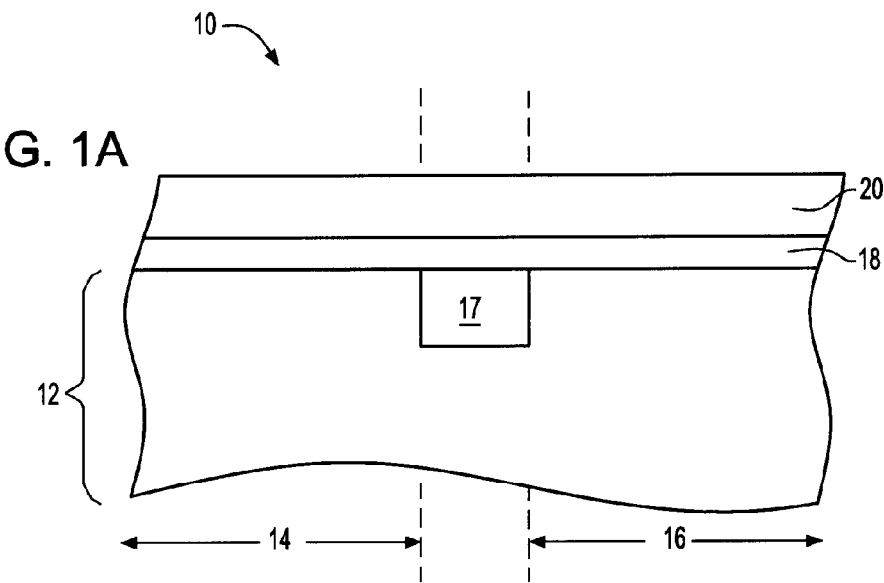
FIGS. 1A-1F are pictorial representations (through cross sectional views) depicting one embodiment of the present invention.

The present invention, which provides a dual metal integration scheme for fabricating fully silicided gate electrodes having workfunctions tailored for a specific device region, will now be described in greater detail by referring to the following discussion and drawings that accompany the present application. The drawings of the present application, which are referred to herein below in greater detail, are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

Reference is first made to FIGS. 1A-1F which illustrate a first embodiment of the method of the present invention. Specifically, the first embodiment of the present invention begins by providing the initial structure 10 shown in FIG. 1A. As is illustrated, the initial structure 10 includes a semiconductor substrate 12 having a least one pFET device region 14 and at least one nFET device region 16 located therein. The various device regions are separated in part by an isolation region 17. The initial structure 10 also includes a gate dielectric layer 18 and a blanket Si layer 20 located atop a surface of the semiconductor substrate 12 in both device regions. It is noted that the term 'nFET device region' is a predetermined area within the semiconductor substrate 12 in which at least one nFET device will be subsequently formed. The term 'pFET device region' is a predetermined area within the semiconductor substrate 12 in which at least one pFET device will be subsequently formed.

The semiconductor substrate 12 of the initial structure 10 includes any semiconducting material including, for example, Si, SiGe, SiGeC, SiC, Ge alloys, GaAs, InAs, InP and other III/V or II/VI compound semiconductors. In addition to these listed types of semiconducting materials, the present invention also contemplates cases in which the semiconductor substrate 12 is a layered semiconductor such as, for example, Si/SiGe, Si/SiC, silicon-on-insulators (SOIs) or silicon germanium-on-insulators (SGOIs). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein.

It is also noted that the semiconductor substrate 12 may be strained, unstrained or contain strained regions and unstrained regions therein. The semiconductor substrate 12 may also have a single crystal orientation or alternatively, the substrate 12 may be a hybrid semiconductor substrate that has surface regions having different crystallographic orientations. For example, the semiconductor substrate 12 within the nFET device region 16 may have a surface crystal orientation that is (100), while the semiconductor substrate within the pFET device region 14 may have a surface crystal orientation that is (110). The hybrid substrates may have bulk characteristics, SOI like characteristics or combinations of both bulk and SOI characteristics.

The semiconductor substrate 12 may also have one or more isolation regions 17 such as, for example, trench isolation regions or field oxide isolation regions, located therein. The one or more isolation regions 17, which are typically present between the nFET device region 16 and pFET device region 14, are formed utilizing conventional processing which is well known to those skilled in the art of semiconductor device manufacturing. For example, a trench isolation region is formed by providing a trench opening in the substrate 12 by lithography and etching, filling the trench opening with a trench dielectric and, optionally, planarizing the structure. The trench dielectric is typically comprised of an oxide. A local oxidation of silicon (LOCOS) technique can be used in forming the field oxide region.

The gate dielectric 18 is formed on the surface of the semiconductor substrate 12 after the substrate has been processed. The gate dielectric 18 can be formed by a thermal growing process such as, for example, oxidation. Alternatively, the gate dielectric 18 can be formed by a deposition process such as, for example, chemical vapor deposition (CVD), plasma-assisted CVD, atomic layer or pulsed deposition (ALD or ALPD), evaporation, reactive sputtering, chemical solution deposition or other like deposition processes. The gate dielectric 18 may also be formed utilizing any combination of the above processes.

The gate dielectric 18 is comprised of an insulating material (or material stack) having a dielectric constant of about 4.0 or greater, preferably greater than 7.0. The dielectric constants mentioned herein are relative to a vacuum, unless otherwise stated. Note that $SiO_2$ typically has a dielectric constant that is about 4.0. Specifically, the gate dielectric 18 employed in the present invention includes, but is not limited to: an oxide, nitride, oxynitride and/or silicates including metal silicates, aluminates, titanates and nitrides. In one embodiment, it is preferred that the gate dielectric 18 is comprised of an oxide such as, for example, $SiO_2$, $HfO_2$, $ZrO_2$, $Al_2O_3$, $TiO_2$, $La_2O_3$, $SrTiO_3$, $LaAlO_3$, $Y_2O_3$ and mixtures thereof. Of these oxides, $SiO_2$ is typically used as the gate dielectric material.

The physical thickness of the gate dielectric 18 may vary, but typically, the gate dielectric 18 has a thickness from about 0.5 to about 10 nm, with a thickness from about 0.5 to about 5 nm being more typical.

After forming the gate dielectric 18, a Si layer 20 is formed on the gate dielectric 18 utilizing a known deposition process such as, for example, physical vapor deposition (PVP), CVD or evaporation. The Si layer 20 may be polycrystalline or amorphous, with polycrystalline being highly preferred in the present application. The Si layer 20 is typically undoped at this point of the present invention. Typically, the Si layer 20 used in this embodiment of the present invention has a vertical thickness from about 10 nm to about 30 nm, with a thickness from about 15 nm to about 25 nm being more typical.

A patterned hard mask 24 is now formed on a surface of the Si layer 20 so as to protect the nFET device region 16, leaving the pFET device region 14 unprotected. The patterned hard mask 24 is formed by first applying a layer of hard mask material to the surface of Si layer 20 in both of the device regions. The layer of hard mask material can be formed utilizing a thermal process such as, for example, oxidation, nitridation or oxynitridation. Alternatively, a deposition process such as, for example, CVD, PECVD, PVP, atomic layer deposition, evaporation or chemical solution deposition, can be used in forming the layer of hard mask material. Combinations of the aforementioned techniques are also contemplated for forming the layer of hard mask material. The hard mask material is comprised of an oxide, nitride, oxynitride, or any combination, including multilayers thereof. Typically, the hard mask material is comprised of $SiO_2$.

The as-deposited thickness of the layer of hard mask material may vary depending on, for example, the technique used in forming that material layer. Typically, the hard mask material has an as-deposited thickness from about 10 nm to about 50 nm, with a thickness from about 30 nm to about 40 nm being even more typical.

After forming the layer of hard mask material on the Si layer 20 in both device regions, a blanket layer of photoresist material (not shown) is then formed atop the layer of hard mask material. The photoresist material employed in the present invention includes a conventional positive-tone, negative-tone or hybrid photoresist. The photoresist material is formed by a conventional deposition process including, for example, spin-on coating, CVD, PECVD, or evaporation. After forming the blanket layer of photoresist material on the hard mask 24, the photoresist material is subjected to lithography which includes exposing the resist to a desired pattern of radiation and developing the exposed resist material utilizing a conventional resist developer. In the present application, the lithographic process provides a patterned photoresist material that is present atop the layer of hard mask material in the nFET device region 16, while the layer of hard mask material in pFET device region 14 is unprotected.

The unprotected layer of hard mask material within the pFET device region 14 is then selectively removed utilizing an etching process that is capable of selectively removing the exposed hard mask material, stopping on a surface of the underlying Si layer 20. The resultant structure that is formed after the selective removal process has been performed is shown, for example, in FIG. 1B. The etching process performed in forming the structure shown in FIG. 1B includes dry etching such as, for example, reactive ion etching, ion beam etching or plasma etching, or a chemical wet etching process. When a chemical wet etching process is used in selectively removing the exposed hard mask material from the pFET device region 14, a chemical etchant such as, for example, HF, can be used to remove the exposed portion of the hard mask material. As shown, the underlying Si layer 20 within the pFET device region 14 is exposed after the selective removal process has been performed. After etching, the patterned photoresist material is stripped from the structure utilizing a conventional resist stripping process.

Figure 1B:
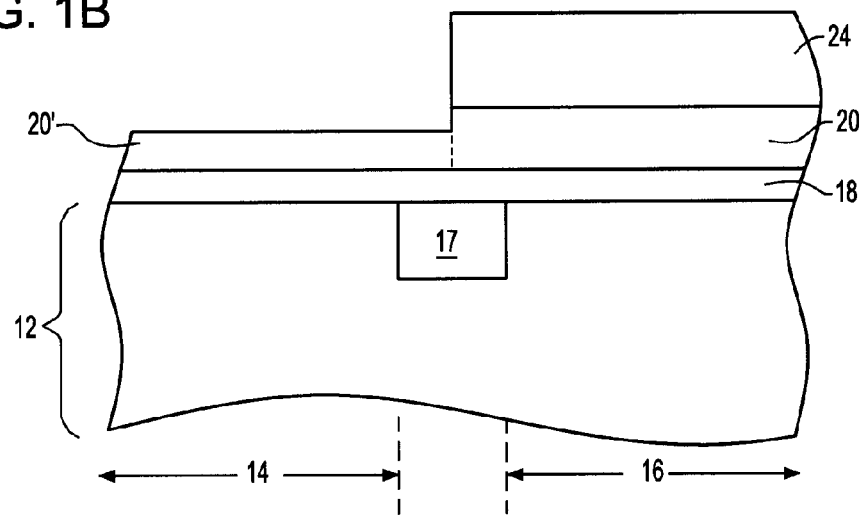

It is noted during this step of the first embodiment of the present invention, the Si layer 20 within the pFET device region 14 is also thinned to a range from about 5 nm to about 15 nm, with a range from about 7 nm to about 12 nm being more typical. If additional thinning is required to achieve the above thickness range from the etching described above, a timed etching process can be used to reduce the thickness of the exposed Si layer 20 in the pFET device region 14. In FIG. 1B, the thinned Si layer within the pFET device region 14 is now designated as 20' to distinguish that layer from the Si layer 20 remaining in the nFET device region 16.

After thinning the exposed Si layer 20 within the pFET device region 14, the patterned hard mask 24 that protected the nFET device region 16 is selectively removed utilizing an etching process that selectively removes the hard mask material. For example, when the hard mask material is an oxide, HF can be used to remove the patterned hard mask 24 that was used to protect the nFET device region 16.

Figure 1C:
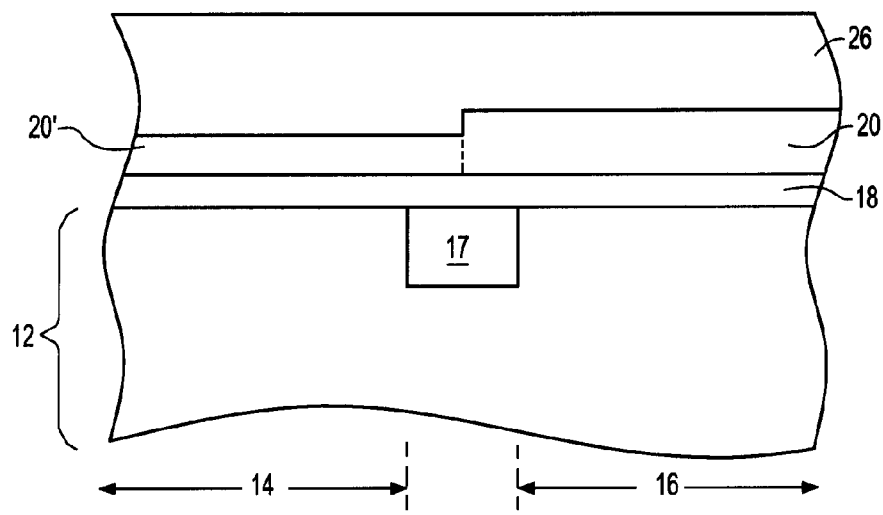

Next, and as shown in FIG. 1C, a Ge-containing layer 26 is formed atop the surface of the thinned Si layer 20' and the non-thinned layer 20 in both of the device regions. The resultant structure including the Ge-containing layer 26 is shown, for example, in FIG. 1C. The Ge-containing layer 26 includes a SiGe alloy that comprises up to 99.99 atomic percent Ge. Preferably, the Ge content in the SiGe layer is from about 15 to about 50 atomic percent, with a Ge atomic percent from about 30 to about 40 being even more highly preferred. It is noted that the above range of Ge within the Ge-containing layer 26 ensures that the Ge-containing layer 26 can be etched selectively as compared to the underlying Si layer. The SiGe alloys may be single-crystal, amorphous or polycrystalline, with polycrystalline being highly preferred.

In accordance with the present invention, the Ge-containing layer 26 is formed using any conventional epitaxial growth method that is well known to those skilled in the art. Illustrative examples of epitaxial growing processes that can be used in the present invention include, but are not limited to: low-pressure chemical vapor deposition (LPCVD), ultra-high vacuum chemical vapor deposition (UHVCVD), atmospheric pressure chemical vapor deposition (APCVD), molecular beam (MBE) epitaxy and plasma-enhanced chemical vapor deposition (PECVD).

The thickness of the Ge-containing layer 26 formed at this point of the present invention may vary, but typically the Ge-containing layer 26 has a thickness from about 10 nm to about 300 nm, with a thickness from about 50 nm to about 200 nm being more highly preferred.

Figure 1D:
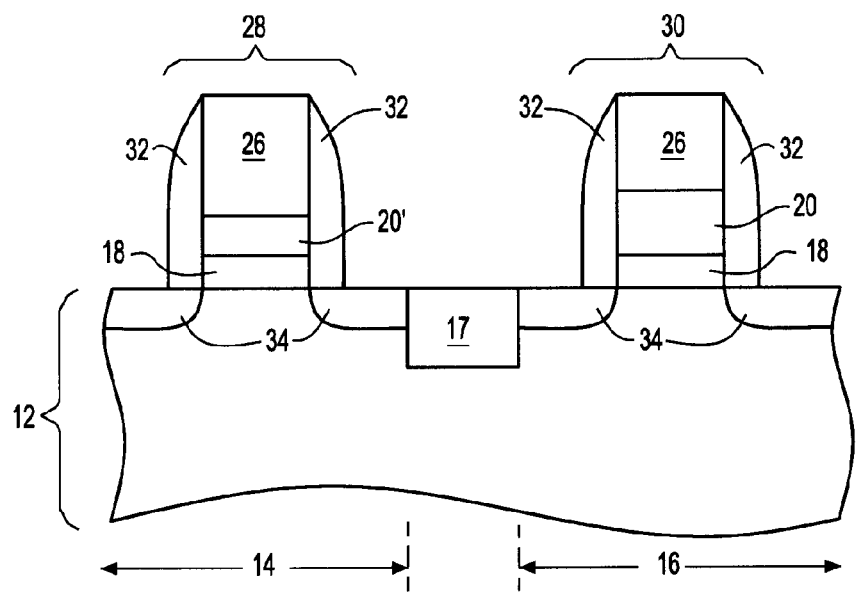

FIG. 1D shows the structure that is formed after further complementary metal oxide semiconductor (CMOS) processing wherein one pFET device 28 is formed within the pFET device region 14 and at least one nFET device 30 is formed within the nFET device region 16. Each of the FET devices includes a patterned gate stack comprising, from bottom to top, the gate dielectric 18, a Si film (thinned Si layer 20' for the pFET device, and a thicker Si film 20 for the nFET device), and the Ge-containing layer 26.

The patterned gate stacks shown in FIG. 1D are formed by lithography and etching. The lithographic process includes applying a photoresist material (not shown) to the Ge-containing layer 26, exposing the photoresist material to a pattern of radiation, and developing the exposed resist utilizing a conventional resist developer. Etching of the patterned stacks is typically performed utilizing a dry etching process such as reactive ion etching, ion beam etching, or plasma etching. Alternatively, a chemical wet etching process can be used to etch each of the gate stacks. In addition to these specified etching techniques, the present invention also contemplates utilizing any combination thereof.

Each FET shown in FIG. 1D may also include at least one spacer 32 that is typically, but not always, formed on exposed sidewalls of each patterned gate stack. The at least one spacer 32 is comprised of an insulator such as an oxide, nitride, oxynitride and/or any combination thereof. The at least one spacer 32 is formed by deposition and etching. The width of the at least one spacer 32 must be sufficiently wide such that the source and drain silicide contacts (to be subsequently formed) do not encroach underneath the edges of the patterned gate stack. Typically, the source/drain silicide does not encroach underneath the edges of the patterned gate stack when the at least one spacer 32 has a width, as measured at the bottom, from about 20 to about 80 nm.

The patterned gate stacks can also be passivated at this point of the present invention by subjecting the same to a thermal oxidation, nitridation or oxynitridation process. The passivation step forms a thin layer of passivating material (not shown) about the material stack. This step may be used instead, or in conjunction with, the previous step of spacer formation. When used with the spacer formation step, spacer formation occurs after the material stack passivation process.

Source/drain diffusion regions 34 are then formed into the substrate 12 at this point of the present invention. The source/drain diffusion regions 34 are formed utilizing ion implantation and an annealing step. In accordance with the present invention, at least the patterned gate stacks within each device region serve as an implantation mask during the formation of the source/drain regions 34. A raised source/drain process may be used. The annealing step serves to activate the dopants that were implanted by the previous implant step. The conditions for the ion implantation and annealing are well known to those skilled in the art. The source/drain diffusion regions 34 may also include extension implant regions which are formed prior to source/drain implantation using a conventional extension implant. The extension implant may be followed by an activation anneal, or alternatively the dopants implanted during the extension implant and the source/drain implant can be activated using the same activation anneal cycle. Halo implants are also contemplated herein.

Figure 1E:
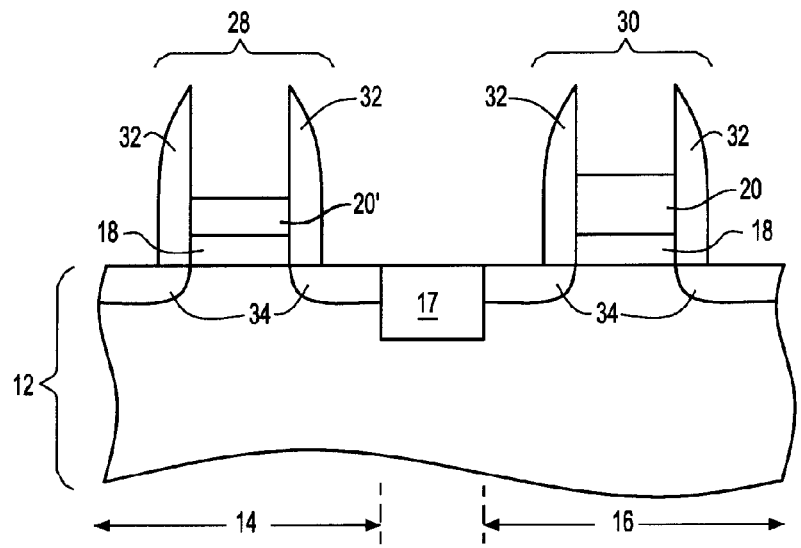

FIG. 1E shows the structure after the Ge-containing layer 26 is selectively removed from each of the patterned gate stacks exposing either the thinned Si layer 20' in the pFET device region 14 or the non-thinned Si layer 20 in the nFET device region 16. The selective removal process is performed utilizing an etching process that selectively removes the Ge-containing layer as compared to that of the underlying Si layer. In a preferred embodiment, it is desirable to remove the Ge-containing layer prior to the source/drain annealing step. This is to minimize Ge diffusion and thus maintain better control of silicon layer thickness (20 and 20').

At this point of the first embodiment of the present invention, Ge can be implanted selectively into the thinned Si layer 20' within the pFET device region 14. The selective implant is performed utilizing a patterned mask (not shown) which protects the other areas of the structure from receiving this Ge implant. The dose of Ge implant may vary so long as the peak distribution of Ge remains within the thinned Si layer 20'. Typically, the ion implantation is performed utilizing a Ge dosage from about 1e15 to about 1e16 Ge atoms/cm$^2$. In one embodiment, a 5E15 implant dose of Ge is provided to the thinned Si layer 20' which results in the Si layer 20' having a Ge content of about 10%. The presence of the Ge atoms within the thinned Si layer 20' helps to modulate the workfunction of the pFET FUSI gate electrode to be subsequently formed.

In some embodiments, the non-thinned Si layer 20 within the nFET device region 16 can now be doped with an n-type dopant utilizing a selective ion implantation process well known to those skilled in the art.

A layer including at least one metal (not shown) is then formed atop the exposed surfaces of the structure shown in FIG. 1E including atop the exposed thinned Si layer 20', the non-thinned Si layer 20, as well as atop the source/drain diffusion regions 34. This metal-containing layer is formed utilizing a conventional deposition process including, but not limited to: sputtering, plating, CVD, atomic layer deposition or chemical solution deposition. The layer including at least one metal is comprised of any metal that is capable of forming a metal silicide when in contact with silicon and subjected to annealing. Suitable metals include, but are not limited to: Co, Ni, Ti, W, Mo, Ta and alloys or multilayers thereof. Preferred metals include: Ni, Co and Ti, with Ni being highly preferred.

In some embodiment of the present invention, the metal-containing layer used in forming the silicide includes at least one alloying additive in an amount of up to 50 atomic weight percent. The alloying additive, when present, can be formed at the same time as that of the metal-containing layer, or it can be introduced into an as-deposited metal-containing layer utilizing any of several well-known techniques, including ion implantation or gas phase doping. Examples of alloying additives include C, Al, Si, Sc, Ti, V, Cr, Mn, Fe, Co, Ni, Cu, Ge, Y, Zr, Nb, Mo, Ru, Rh, Pd, In, Sn, La, Hf, Ta, W, Re, Ir, Pt, Ce, Pr, Nd, Sm, Eu, Gd, Tb, Dy, Ho, Er, Tm, Yb, Lu and mixtures thereof.

The deposited metal used in forming the silicide has a thickness from about 5 nm to about 20 nm, with a thickness from about 7 nm to about 12 nm being more highly preferred.

Next, the structure containing the layer of at least one metal is subjected to an annealing step which is carried out under conditions that are effective in causing the metal to react with the underlying Si-containing regions to form silicide contacts 36 atop the source/drain regions 34, a silicide gate electrode 38 in the pFET device region 14 and a silicide gate electrode 40 in the nFET device region 16. In some embodiments in which the substrate 12 does not include silicon, a silicon layer can be deposited thereon prior to this step of the present invention. It is noted that the silicide gate electrode 38 within the pFET device region 14 and the silicide gate electrode 40 within the nFET device region 16 are both fully silicided gates.

In accordance with the present invention, the silicided gate stack within the pFET device region 14 including silicide gate electrode 38 has a height that is less than the height of the silicided gate stack in the nFET device region. Typically, the variation in gate stack height between the different polarity devices is about 10 nm. It is noted that since a thinned Si layer 20 is used in forming the silicide gate electrode 38 in the pFET device region 14, that silicide has a metal rich silicide phase, while the silicide gate electrode 40 in the nFET device region 16 has a silicon rich silicide phase. By 'silicon rich' it is meant that the silicided gate electrode has a same or greater content of silicon as compared to metal, while metal rich denotes a silicide having a greater content of metal than silicon. That is, the metal rich silicide has the basic formula $M_aSi$ wherein M is one of the above mentioned metals and a is 2 or greater, preferably 2 or 3, while the silicon rich silicide has one of the basic formulas MS (metal monosilicide phase) or $MSi_2$ (metal disilicide phase). In accordance with the present invention, the silicide gate electrode 38 in the pFET device region 38 is a higher resistivity silicide phase than the silicide gate electrode 40 in the nFET device region 16.

It is noted that the fully silicided gate electrodes, i.e., gate electrodes 38 and 40, having the different thickness and thus different phases of silicide enables a technique for tailoring the workfunction for the nFET device region 16 and the pFET device region 14. Moreover, and in the case of the pFET device regions 14, the thinner silicide gate electrode 38 could aide in reducing the capacitance between the overlying contact metallurgy and the pFET gate region.

The annealing step is typically carried out at a temperature from about 400° to about 900° C. More preferably, the annealing step is typically performed at a temperature from about 420° to about 700° C. The annealing step can be performed for various lengths of time depending on the type of annealing process used. For example, furnace annealing is performed for longer lengths of time than are rapid thermal annealing, spike annealing or laser anneal. Typically, a rapid thermal annealing is performed for a time period of from about 1 to about 120 seconds. Note that other temperatures and times may be employed so long as the conditions are capable of causing the formation of silicide regions. The annealing step is typically carried out in a gas ambient that includes He, Ar, $N_2$ or a forming gas.

In some instances, some portion of the layer of at least one metal is not used up in forming the silicide regions. In those embodiments, unreacted metal remains, and the unreacted metal is typically positioned atop the silicide regions. Unreacted metal is then removed providing the structure, shown, for example, in FIG. 1F. Specifically, the unreacted metal, if present, is removed utilizing an etching process that is highly selective in removing metal as compared with silicide. For example, a mixture of hydrogen peroxide and sulfuric acid can be used in removing the remaining unreacted metal from the structure.

Figure 2A:
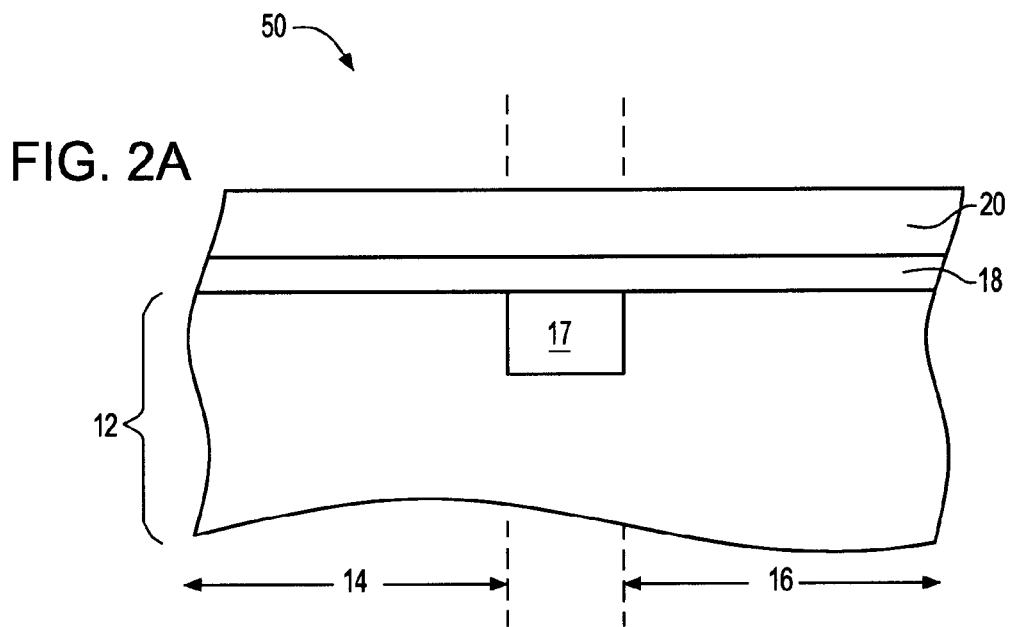
FIGS. 2A-2B are pictorial representations (through cross sectional views) depicting another embodiment of the present invention.
Figure 2B:
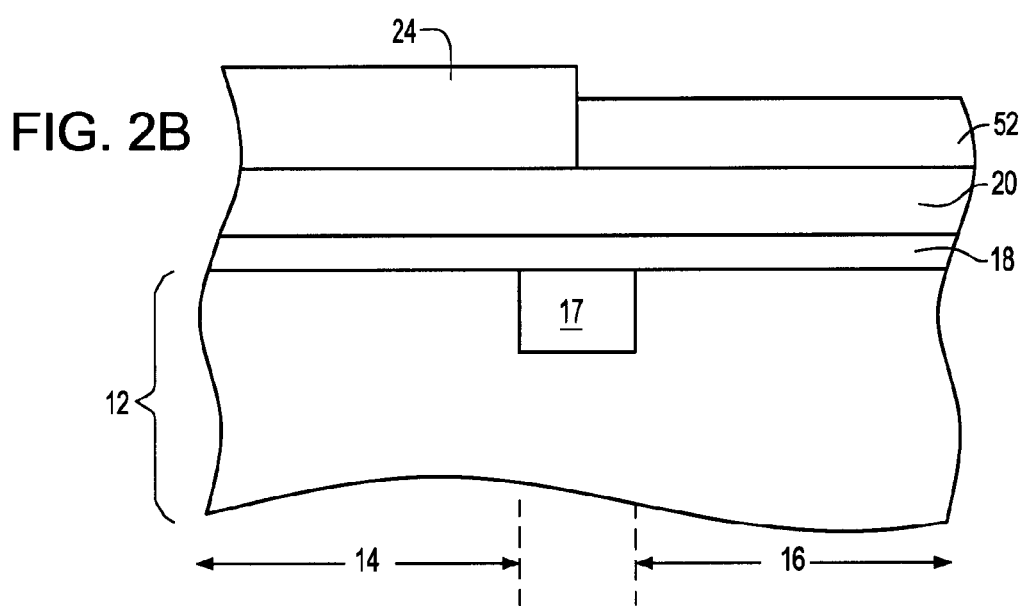

Reference is now made to FIGS. 2A-2B which depict initial stages of a second embodiment of the present application. Specifically, the second embodiment of the present invention begins by providing the initial structure 50 shown in FIG. 2A. It is noted that the initial structure 50 shown in FIG. 2A is the same as the initial structure 10 shown in FIG. 1A. As is illustrated, the initial structure 50 includes a semiconductor substrate 12 having a least one pFET device region 14 and at least one nFET device region 16 located therein. The various device regions are separated in part by an isolation region 17. The initial structure also includes a gate dielectric layer 18 and a blanket Si layer 20 located atop a surface of the semiconductor substrate 12 in both device regions. The above description regarding each of the regions, materials and methods of fabricating the same are also applicable here for the second embodiment of the present invention.

Unlike the first embodiment of the present invention wherein the patterned hard mask 24 protected the nFET device region 16, in the second embodiment, the patterned hard mask 24 protects the pFET device region 14. The materials and processing used in forming the patterned hard mask 24 described above are applicable here except that the patterned resist is formed atop the hard mask 24 in the pFET device region 14. After protecting the pFET device region 14 with the patterned hard mask 24, an additional Si layer 52 is formed on the surface of the exposed Si layer 20 in the nFET device region. The resultant structure in the patterned hard mask 24 and the additional Si layer 52 is shown, for example, in FIG. 2B.

Figure 1F:
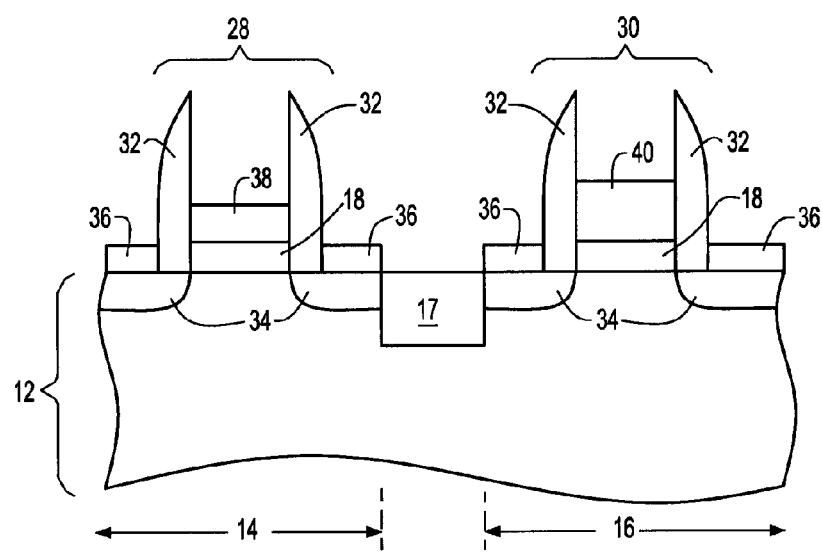

The additional Si layer 52 is formed utilizing a conventional epitaxial growth process well known in the art. The additional Si layer 52 makes the total thickness of the Si present in the nFET device region 16 greater than that in the pFET device region 14. This step of the second embodiment eliminates the need for thinning the Si layer 20 in the first embodiment. As such, this step shown in FIG. 2B is used instead of the thinning step shown in FIG. 1B. After removing the patterned hard mask 24 from atop the pFET device region 14, the remaining processing flow as shown in FIGS. 1C-1F are then followed. It is noted that in the second embodiment a structure as shown in FIG. 1F is provided as well. As such, the silicided gate stack within the pFET device region 14 including the silicide gate electrode 38 has a height that is less than the height of the silicided gate stack in the nFET device region. It is noted that since a thinned Si layer is used in forming the silicide gate electrode 38 in the pFET device region 14, that silicide has a metal rich phase, while the silicide gate electrode 40 in the nFET device region 16 has a silicon rich phase. It is noted that the fully silicided gate electrodes, i.e., gate electrodes 38 and 40, having the different thickness and thus different phases of silicide enables a technique for tailoring the workfunction for the nFET device region 16 and the pFET device region 14. Moreover, and in the case of the pFET device regions 14, the thinner silicide gate electrode 38 could aide in reducing the capacitance between the overlying contact metallurgy and the pFET gate region.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure including fully silicide gates comprising:

provideing a Si layer on a surface of a gate dielectric layer that is located on a semiconductor substrate having at least one pFET device region and at least one nFET device region, said Si layer atop said at least one pFET device region has a first thickness and said Si layer atop said at least one nFET device region has a second thickness, said first thickness is less than said second thickness;

forming a Ge-containing layer atop said Si layer in both device regions;

forming a least one patterned gate stack in said pFET device region and forming at least one patterned gate stack in said nFET device region, each patterned gate stack comprises, from bottom to top, the gate dielectric layer, the Si layer and the Ge-containing layer;

forming source/drain regions in said semiconductor substrate using each of said patterned gate stacks as an implant mask;

selectively removing the Ge-containing layer of each patterned gate stack thereby exposing said Si layer; and performing a silicidation process that frilly converts said Si layer within each device region into a silicide gate electrode, while simultaneously forming silicided source/drain regions, wherein said silicide gate electrode in said pFET device region has a height that is less than a height of the silicide gate electrode in the nFET device region, and the silicide gate electrode in said pFET device region comprises a metal rich silicide phase, while the silicide gate electrode in said nFET device region comprises a silicon rich silicide phase.

2. The method of claim 1 wherein said providing said Si layer comprises depositing a blanket layer of silicon atop the gate dielectric layer in both of the device regions; forming a patterned hard mask atop the Si layer in the nFET device region thereby protecting the Si layer in that region from a subsequent etching process; and thinning the exposed Si layer in the pFET device region by etching.

3. The method of claim 2 wherein said etching comprises dry etching or chemical wet etching.

4. The method of claim 1 wherein said providing said Si layer comprises depositing a blanket layer of silicon atop the gate dielectric layer in both of the device regions; forming a patterned hard mask atop the Si layer in the pFET device region thereby protecting the Si layer in that region; and forming an additional Si layer in the nFET device region.

5. The method of claim 4 wherein said forming said additional Si layer comprises an epitaxial growth process.

6. The method of claim 1 wherein said Ge-containing layer comprises a SiGe alloys comprising up to 99.99 atomic % Ge.

7. The method of claim 1 wherein said forming said at least one patterned gate stack in each of the device regions comprises lithography and etching.

8. The method of claim 1 wherein said selective removing of said Ge-containing layer from each patterned gate stack comprises etching.

9. The method of claim 1 further comprising implanting Ge atoms into the exposed Si layer within the pFET device region after the selective removing step, but prior to silicidation.

10. The method of claim 1 further comprising implanting n-type dopants into the exposed Si layer within the nFET device region after the selective removing step, but prior to silicidation.

11. The method of claim 1 wherein said performing said silicidation process comprises depositing a metal-containing layer and annealing to cause reaction and subsequent silicide formation between said metal-containing layer and at least said Si layer.

12. A method of forming a semiconductor structure including fully silicide gates comprising:

providing a Si layer on a surface of a gate dielectric layer that is located on a semiconductor substrate having at least one pFET device region and at least one nFET device region, said providing said Si layer comprises depositing a blanket layer of silicon atop the gate dielectric layer in both of the device regions, forming a patterned hard mask atop the Si layer in the nFET device region thereby protecting the Si layer in that region from a subsequent etching process, and thinning the exposed Si layer in the pFET device region by etching, and said Si layer atop said at least one pFET device region has a first thickness and said Si layer atop said at least one nFET device region has a second thickness, said first thickness is less than said second thickness;

forming a Ge-containing layer comprising a polycrystalline SiGe alloy having up to 99.99 atomic % Ge by epitaxy on said Si layer in both device regions;

forming a least one patterned gate stack in said pFET device region and forming at least one patterned gate stack in said nFET device region, each patterned gate stack comprises, from bottom to top, the gate dielectric layer, the Si layer and the Ge-containing layer;

forming source/drain regions in said semiconductor substrate using each of said patterned gate stacks as an implant mask;

selectively removing the Ge-containing layer of each patterned gate stack by etching thereby exposing said Si layer;

implanting Ge atoms into the exposed Si layer within the pFET device region;

implanting n-type dopants into the exposed Si layer within the nFET device region; and performing a silicidation process that hilly converts said Si layer within each device region into a silicide gate electrode, while simultaneously forming silicided source/drain regions, wherein said silicide gate electrode in said pFET device region has a height that is less than a height of the silicide gate electrode in the nFET device region, and the silicide gate electrode in said pFET device region comprises a metal rich silicide phase, while the silicide gate electrode in said nFET device region comprises a silicon rich silicide phase.

* * * * *

UNITED STATES PATENT AND TRADEMARK OFFICE
CERTIFICATE OF CORRECTION

PATENT NO.         : 7,605,077 B2                                              Page 1 of 1
APPLICATION NO.  : 11/308486
DATED              : October 20, 2009
INVENTOR(S)        : Henson et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 683 days.

Signed and Sealed this

Fifth Day of October, 2010

David J. Kappos
*Director of the United States Patent and Trademark Office*